United States Patent
Qian et al.

(10) Patent No.: US 9,484,212 B1
(45) Date of Patent: Nov. 1, 2016

(54) CHEMICAL MECHANICAL POLISHING METHOD

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Yi Guo, Newark, DE (US); Marty W. DeGroot, Middletown, DE (US); George C. Jacob, Newark, DE (US)

(73) Assignees: Rohm and Haas Electronic Materials CMP Holdings, Inc., Newark, DE (US); Dow Global Techologies LLC, Midland, MI (US)

( * ) Notice: Subject to any disclaimer, the term of this patent is extended or adjusted under 35 U.S.C. 154(b) by 0 days.

(21) Appl. No.: 14/927,704

(22) Filed: Oct. 30, 2015

(51) Int. Cl.
  *H01L 21/306* (2006.01)
  *B24D 11/00* (2006.01)
  *B24B 37/24* (2012.01)

(52) U.S. Cl.
  CPC ......... *H01L 21/30625* (2013.01); *B24B 37/24* (2013.01); *B24D 11/003* (2013.01)

(58) Field of Classification Search
  None
  See application file for complete search history.

(56) References Cited

U.S. PATENT DOCUMENTS

| | | | |
|---|---|---|---|
| 5,578,362 A | 11/1996 | Reinhardt et al. | |
| 6,645,264 B2 | 11/2003 | Hasegawa et al. | |
| 6,649,523 B2 | 11/2003 | Basol et al. | |
| 6,790,883 B2 | 9/2004 | Ogawa et al. | |
| 6,992,123 B2 | 1/2006 | Shiho et al. | |
| 7,077,879 B2 | 7/2006 | Ogawa et al. | |
| 7,217,179 B2 | 5/2007 | Sakurai et al. | |
| 7,294,576 B1 | 11/2007 | Chen et al. | |
| 7,488,236 B2 | 2/2009 | Shimomura et al. | |
| 7,651,761 B2 | 1/2010 | Shimomura et al. | |
| 7,704,125 B2 | 4/2010 | Roy et al. | |
| 7,922,783 B2 | 4/2011 | Sakurai et al. | |
| 7,927,452 B2 | 4/2011 | Hirose et al. | |
| 8,052,507 B2 | 11/2011 | Huang et al. | |
| 8,167,690 B2 | 5/2012 | Fukuda et al. | |
| 8,980,749 B1* | 3/2015 | Itai | H01L 21/02024 438/692 |
| 9,064,806 B1* | 6/2015 | Qian | H01L 21/304 |
| 9,102,034 B2* | 8/2015 | Jensen | B24B 37/205 |
| 9,127,187 B1 | 9/2015 | Grumbine et al. | |
| 9,144,880 B2 | 9/2015 | Qian et al. | |
| 9,216,489 B2* | 12/2015 | Qian | B24B 37/013 |
| 9,233,451 B2* | 1/2016 | Murnane | B24B 37/205 |
| 9,238,295 B2* | 1/2016 | Qian | B24B 37/205 |
| 9,238,296 B2* | 1/2016 | Murnane | B24B 37/22 |
| 9,259,820 B2* | 2/2016 | Qian | B24B 37/013 |
| 9,259,821 B2* | 2/2016 | Qian | B24B 37/24 |
| 9,314,897 B2* | 4/2016 | Qian | B24B 37/205 |
| 9,333,620 B2* | 5/2016 | Qian | B24B 37/013 |
| 2007/0037491 A1 | 2/2007 | Li et al. | |
| 2009/0062414 A1 | 3/2009 | Huang et al. | |
| 2010/0029185 A1 | 2/2010 | Fukuda et al. | |
| 2010/0317261 A1* | 12/2010 | Kulp | B24B 37/205 451/41 |
| 2010/0317263 A1 | 12/2010 | Hirose et al. | |
| 2011/0034578 A1 | 2/2011 | Zhang et al. | |
| 2011/0039966 A1 | 2/2011 | Goto et al. | |
| 2011/0151240 A1 | 6/2011 | Hirose et al. | |
| 2011/0256817 A1 | 10/2011 | Fukuda et al. | |
| 2012/0009855 A1 | 1/2012 | Allison et al. | |
| 2012/0015519 A1 | 1/2012 | Huang et al. | |
| 2015/0375361 A1* | 12/2015 | Qian | B24B 37/205 216/53 |
| 2015/0375362 A1* | 12/2015 | Qian | B24B 37/24 438/693 |
| 2016/0176012 A1* | 6/2016 | Qian | C08G 18/758 51/296 |

\* cited by examiner

*Primary Examiner* — Allan Olsen
(74) *Attorney, Agent, or Firm* — Thomas S. Deibert

(57) ABSTRACT

A chemical mechanical polishing method is provided comprising: providing a substrate, wherein the substrate comprises a silicon oxide and a silicon nitride; providing a polishing slurry; providing polishing pad, comprising: a polishing layer having a composition that is a reaction product of ingredients, comprising: a polyfunctional isocyanate and an amine initiated polyol curative; wherein the stoichiometric ratio of the amine initiated polyol curative to the polyfunctional isocyanate is selected to tune the removal rate selectivity of the polishing layer; creating dynamic contact between the polishing surface and the substrate; dispensing the polishing slurry on the polishing pad at or near the interface between the polishing surface and the substrate; and, removing at least some of the silicon oxide and the silicon nitride from the substrate.

10 Claims, No Drawings

CHEMICAL MECHANICAL POLISHING METHOD

The present invention relates to a chemical mechanical polishing method. More particularly, the present invention relates to a chemical mechanical polishing method is provided comprising: providing a substrate, wherein the substrate comprises a silicon oxide and a silicon nitride; providing a polishing slurry; providing polishing pad, comprising: a polishing layer having a composition that is a reaction product of ingredients, comprising: a polyfunctional isocyanate and an amine initiated polyol curative; wherein the stoichiometric ratio of the amine initiated polyol curative to the polyfunctional isocyanate is selected to tune the removal rate selectivity of the polishing layer; creating dynamic contact between the polishing surface and the substrate; dispensing the polishing slurry on the polishing pad at or near the interface between the polishing surface and the substrate; and, removing at least some of the silicon oxide and the silicon nitride from the substrate.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

Devices are becoming increasingly complex with finer features. This trend requires improved performance from polishing consumables in order to provide tunable selectivities between the materials used to create various features on the substrate to provide device designers with increased flexibility in those designs. Accordingly, to support the dynamic field of device designs for use in the manufacture of semiconductor systems there exists a continued need for chemical mechanical polishing consumables that provide a desirable balance of polishing properties to suit changing design needs. For example, there is a continuing need for polishing consumables that exhibit a removal rate selectivity between silicon oxide and silicon nitride.

Historically, the providers of polishing consumables have focused on slurry formulations to provide the desired removal rate selectivity between different substrate materials. For example, a tunable selectivity slurry for chemical mechanical polishing is disclosed by Chen et al. in U.S. Pat. No. 7,294,576. Chen et al. disclose a method of chemically-mechanically polishing a substrate, which method comprises: (a) providing a substrate with at least a first layer and a second layer, wherein the first layer and the second layer have not been contacted with a chemical-mechanical polishing composition, (b) preparing a final chemical-mechanical polishing composition comprising the steps of: (i) providing a first chemical-mechanical polishing composition comprising an abrasive with a first selectivity for a first layer as compared to a second layer, (ii) providing a second chemical-mechanical polishing composition comprising an abrasive with a second selectivity for the first layer as compared to the second layer, wherein the second chemical-mechanical polishing composition is stable in the presence of the first chemical-mechanical polishing composition, and wherein the first and second selectivities are different, and (iii) mixing the first and second chemical-mechanical polishing compositions in a ratio to achieve a final chemical-mechanical polishing composition with a final selectivity for the first layer as compared to the second layer, (c) contacting the substrate with the final chemical-mechanical polishing composition, (d) moving the polishing pad relative to the substrate with the final chemical-mechanical polishing composition therebetween, and (e) abrading at least a portion of the first and second layers of the substrate to polish the substrate.

Notwithstanding, there is a continuing need for polishing consumable offerings that broaden the range of removal rate selectivities available to device designers. Accordingly, it would be desirable to provide chemical mechanical polishing pads having polishing layer compositions that are selected to enhance the removal rate selectivity available for semiconductor device designers.

The present invention provides a method of chemical mechanical polishing a substrate, comprising: providing the substrate, wherein the substrate comprises a silicon oxide and a silicon nitride; providing a polishing slurry, comprising: water; and, a silica abrasive, wherein the silica abrasive has a positive surface charge measured at a polishing pH of 1 to 6; providing a chemical mechanical polishing pad, comprising: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) optionally, a plurality of microelements; wherein a stoichiometric ratio of reactive hydrogen groups in the amine initiated polyol curative of (b) to the at least two unreacted isocyanate (NCO) groups in the polyfunctional isocyanate of (a) is selected to tune the removal rate selectivity; and wherein the stoichiometric ratio of reactive hydrogen groups in the amine initiated polyol curative of (b) to the at least two unreacted isocyanate (NCO) groups in the polyfunctional isocyanate of (a) is 1.25 to 1.8; creating dynamic contact at an interface between the polishing surface and the substrate to polish a surface of the substrate; dispensing the polishing slurry onto the chemical mechanical polishing pad at or near the interface between the polishing surface and the substrate; and, removing at least some of the silicon oxide and the silicon nitride from the substrate.

The present invention provides a method of chemical mechanical polishing a substrate, comprising: providing the substrate, wherein the substrate comprises a silicon oxide and a silicon nitride; providing a polishing machine having a rotating platen, a rotating head and a rotating conditioner; providing a polishing slurry, comprising: water; and, a silica abrasive, wherein the silica abrasive has a positive surface charge measured at a polishing pH of 1 to 6; providing a chemical mechanical polishing pad, comprising: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) optionally, a plurality of microelements; wherein a stoichiometric ratio of reactive hydrogen groups in the amine initiated polyol curative of (b) to the at least two unreacted isocyanate (NCO) groups in the polyfunctional isocyanate of (a) is selected to tune the removal rate selectivity; and wherein the stoichiometric ratio of reactive hydrogen groups in the amine initiated polyol curative of (b) to the at least two unreacted isocyanate (NCO) groups in the polyfunctional isocyanate of (a) is 1.25 to 1.8; wherein the polishing layer is mounted to the rotating platen; wherein the substrate is secured to the rotating head; creating dynamic contact at an interface between the polishing surface and the substrate to polish a surface of the substrate; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; dispensing the polishing slurry onto the chemical mechanical polishing pad at or near the interface between the polishing surface and the substrate; wherein the polishing slurry is supplied to the polishing surface at a flow rate of 200 mL/min; and, removing at least some of the silicon oxide and the silicon nitride from the substrate.

The present invention provides a chemical mechanical polishing pad, comprising: a polishing layer having a composition, a polishing surface and a removal rate selectivity between a silicon oxide material and a silicon nitride material; wherein the composition is a reaction product of ingredients, comprising: (a) a polyfunctional isocyanate having an average of at least two unreacted isocyanate (NCO) groups per molecule; and, (b) an amine initiated polyol curative, wherein the amine initiated polyol curative contains at least one nitrogen atom per molecule and wherein the amine initiated polyol curative has an average of at least three hydroxyl groups per molecule; wherein a stoichiometric ratio of reactive hydrogen groups in the amine initiated polyol curative of (b) to the at least two unreacted isocyanate (NCO) groups in the polyfunctional isocyanate of (a) is 1.25 to 1.8; and, wherein the stoichiometric ratio of reactive hydrogen groups in the amine initiated polyol curative of (b) to the at least two unreacted isocyanate (NCO) groups in the polyfunctional isocyanate of (a) is selected to tune the removal rate selectivity.

The present invention provides a method of making a polishing layer for a chemical mechanical polishing pad, comprising: providing (a) a polyfunctional isocyanate having an average of at least two unreacted isocyanate (NCO) groups per molecule; and, providing (b) an amine initiated polyol curative, wherein the amine initiated polyol curative contains at least one nitrogen atom per molecule and wherein the amine initiated polyol curative has an average of at least three hydroxyl groups per molecule; combining the polyfunctional isocyanate and the amine initiated polyol curative to form a combination; wherein a stoichiometric ratio of reactive hydrogen groups in the amine initiated polyol curative to the at least two unreacted isocyanate (NCO) groups in the polyfunctional isocyanate in the combination is 1.25 to 1.8; and, wherein the stoichiometric ratio of reactive hydrogen groups in the amine initiated polyol curative of (b) to the at least two unreacted isocyanate (NCO) groups in the polyfunctional isocyanate of (a) in the combination is selected to tune a silicon dioxide to silicon nitride removal rate selectivity of the polishing layer.

DETAILED DESCRIPTION

It has surprisingly be found that the removal rate selectivity between a silicon oxide material and a silicon nitride material for a polishing layer in a chemical mechanical polishing pad provided in the method of the present invention is fine tunable through the judicious selection, in the raw materials used to produce the polishing layer composition, of the stoichiometric ratio of the active hydrogen groups (i.e., the sum of the amine ($NH_2$) groups and the hydroxyl (OH) groups) in the curative to the unreacted isocyanate (NCO) groups in the polyfunctional isocyanate in the range of 1.25 to 1.8. As semiconductor substrates continue to evolve with increasing complexity, the desired array of polishing selectivities required for their manufacture imposes multiple removal rate selectivities between various materials present at the surface of the substrate during a given polishing operation. The removal rate tunability provided by the present invention offers another tool for achieving enhanced removal rate selectivity performance to enable the manufacture of ever more complex substrates.

The method of chemical mechanical polishing a substrate of the present invention, comprises: providing the substrate, wherein the substrate comprises a silicon oxide and a silicon nitride; providing a polishing slurry, comprising: water; and, a silica abrasive (preferably, 0.1 to 6 wt % silica abrasive; more preferably, 0.5 to 5 wt % silica abrasive; most preferably, 0.75 to 2 wt % silica abrasive), wherein the silica abrasive has a positive surface charge measured at a polishing pH of 1 to 6 (preferably 2 to 5; more preferably 2.5 to 5; most preferably 2.75 to 4.75); providing a chemical mechanical polishing pad, comprising: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) optionally, a plurality of microelements; wherein a stoichiometric ratio of reactive hydrogen groups in the amine initiated polyol curative of (b) to the at least two unreacted isocyanate groups in the polyfunctional isocyanate of (a) is selected to tune the removal rate selectivity; and wherein the stoichiometric ratio of reactive hydrogen groups in the amine initiated polyol curative of (b) to the at least two unreacted isocyanate groups in the polyfunctional isocyanate of (a) is 1.25 to 1.8 (preferably, 1.3 to 1.8; more preferably; 1.40 to 1.8; most preferably, 1.45 to 1.75); creating dynamic contact at an interface between the polishing surface and the substrate to polish a surface of the substrate; dispensing the polishing slurry onto the chemical mechanical polishing pad at or near the interface between the polishing surface and the substrate; and, removing at least some of the silicon oxide and the silicon nitride from the substrate.

Preferably, in the method of chemical mechanical polishing a substrate of the present invention, the substrate provided comprises a silicon oxide and a silicon nitride. More preferably, in the method of chemical mechanical polishing a substrate of the present invention, the substrate provided is a semiconductor substrate comprising a silicon oxide and a silicon nitride. Most preferably, in the method of chemical mechanical polishing a substrate of the present invention, the substrate provided is a semiconductor substrate comprising at least one silicon oxide feature and at least one silicon nitride feature; wherein the at least one silicon oxide feature and the at least one silicon nitride feature are exposed to the polishing surface and the polishing slurry during the chemical mechanical polishing; and, wherein at least some of the at least one silicon oxide feature and the at least one silicon nitride feature is removed from the substrate.

Preferably, in the method of chemical mechanical polishing a substrate of the present invention, the polishing slurry provided, comprises: water and a silica abrasive; wherein the silica abrasive has a positive surface charge measured at a polishing pH of 1 to 6 (preferably, 2 to 5; more preferably, 2.5 to 5; most preferably, 2.75 to 4.75). More preferably, in the method of chemical mechanical polishing a substrate of the present invention, the polishing slurry provided, comprises: water; and, 0.1 to 6 wt % of a silica abrasive; wherein the silica abrasive has a positive surface charge measured at a polishing pH of 1 to 6 (preferably, 2 to 5; more preferably, 2.5 to 5; most preferably, 2.75 to 4.75). Still more preferably, in the method of chemical mechanical polishing a substrate of the present invention, the polishing slurry provided, comprises: water; and, 0.5 to 5 wt % of a silica abrasive; wherein the silica abrasive has a positive surface charge measured at a polishing pH of 1 to 6 (preferably, 2 to 5; more preferably, 2.5 to 5; most preferably, 2.75 to 4.75). Most preferably, in the method of chemical mechanical polishing a substrate of the present invention, the polishing slurry provided, comprises: water; and, 0.75 to 2 wt % of a silica abrasive; wherein the silica abrasive has a positive surface charge measured at a polishing pH of 1 to 6 (preferably, 2 to 5; more preferably, 2.5 to 5; most preferably, 2.75 to 4.75).

Preferably, in the method of chemical mechanical polishing a substrate of the present invention, the water contained in the polishing slurry provided is at least one of deionized and distilled to limit incidental impurities.

Preferably, in the method of chemical mechanical polishing a substrate of the present invention, the silica abrasive contained in the polishing slurry provided is a colloidal silica abrasive; wherein the colloidal silica abrasive has a positive surface charge measured at a polishing pH of 1 to 6 (preferably, 2 to 5; more preferably, 2.5 to 5; most preferably, 2.75 to 4.75). More preferably, in the method of chemical mechanical polishing a substrate of the present invention, the silica abrasive contained in the polishing slurry provided is a colloidal silica abrasive having an average particle size of ≤100 nm as measured by dynamic light scattering techniques; wherein the colloidal silica abrasive has a positive surface charge measured at a polishing pH of 1 to 6 (preferably, 2 to 5; more preferably, 2.5 to 5; most preferably, 2.75 to 4.75). Most preferably, in the method of chemical mechanical polishing a substrate of the present invention, the silica abrasive contained in the polishing slurry provided is a colloidal silica abrasive having an average particle size of 5 to 100 nm (more preferably, 10 to 60 nm; most preferably, 20 to 60 nm) as measured by dynamic light scattering techniques; wherein the colloidal silica abrasive has a positive surface charge measured at a polishing pH of 1 to 6 (preferably, 2 to 5; more preferably, 2.5 to 5; most preferably, 2.75 to 4.75).

Preferably, in the method of chemical mechanical polishing a substrate of the present invention, the polishing slurry provided has a polishing pH of 1 to 6. More preferably, in the method of chemical mechanical polishing a substrate of the present invention, the polishing slurry provided has a polishing pH of 2 to 5. Still more preferably, in the method of chemical mechanical polishing a substrate of the present invention, the polishing slurry provided has a polishing pH of 2.5 to 5. Most preferably, in the method of chemical mechanical polishing a substrate of the present invention, the polishing slurry provided has a polishing pH of 2.75 to 4.75.

Preferably, in the method of chemical mechanical polishing a substrate of the present invention, the polishing slurry provided further comprises an additional additive selected from the group consisting of dispersants, surfactants, buffers, anti-foaming agents and biocides.

The polishing layer composition of the polishing layer in the chemical mechanical polishing pad provided in the method of the present invention, is the reaction product of ingredients, comprising: (a) a polyfunctional isocyanate having an average of at least two unreacted isocyanate (NCO) groups per molecule; and, (b) an amine initiated polyol curative, wherein the amine initiated polyol curative contains at least one nitrogen atom per molecule and wherein the amine initiated polyol curative has an average of at least three hydroxyl groups per molecule; wherein the stoichiometric ratio of reactive hydrogen groups (i.e., the sum of the amine ($NH_2$) groups and the hydroxyl (OH) groups) in the amine initiated polyol curative of (b) to the at least two unreacted isocyanate groups in the polyfunctional isocyanate of (a) is selected to tune the removal rate selectivity between silicon oxide and silicon nitride of the polishing layer; and wherein the stoichiometric ratio of reactive hydrogen groups in the amine initiated polyol curative of (b) to the at least two unreacted isocyanate groups in the polyfunctional isocyanate of (a) is 1.25 to 1.8 (preferably, 1.3 to 1.8; more preferably; 1.40 to 1.8; most preferably, 1.45 to 1.75). Through the judicious selection of the stoichiometric ratio, the removal rate selectivity between silicon oxide and silicon nitride of the polishing layer is tunable in a range of 5 to 60.

Preferably, in the method of chemical mechanical polishing a substrate of the present invention, the chemical mechanical polishing pad provided, comprises: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) optionally, a plurality of microelements.

Preferably, the polyfunctional isocyanate having an average of at least two unreacted isocyanate (NCO) groups per molecule is a reaction product of ingredients, including: (i) an aliphatic polyfunctional isocyanate; and, (ii) a prepolymer polyol. More preferably, the polyfunctional isocyanate having an average of at least two unreacted isocyanate (NCO) groups per molecule is a reaction product of ingredients, including: (i) an aliphatic polyfunctional isocyanate, wherein the aliphatic polyfunctional isocyanate is selected from the group consisting of isophorone diisocyanate (IPDI); hexamethylene-1,6-diisocyanate (HDI); 4,4-methylenebis(cyclohexyl isocyanate) ($H_{12}$MDI); 1,4-cyclohexane diisocyanate; 1,3-cyclohexane diisocyanate; 1,2-cyclohexane diisocyanate; 2,2,4-trimethylhexamethylene diisocyanate; 2,4,4-trimethylhexamethylene diisocyanate; 1,4-bis(isocyanatomethyl) cyclohexane; 1,3-bis(isocyanatomethyl) cyclohexane and mixtures thereof; and, (ii) a prepolymer polyol, wherein the prepolymer polyol is selected from the group consisting of diols, polyols, polyol diols, copolymers thereof, and mixtures thereof. Still more preferably, the polyfunctional isocyanate having an average of at least two unreacted isocyanate (NCO) groups per molecule is a reaction product of ingredients, including: (i) an aliphatic polyfunctional isocyanate, wherein the aliphatic polyfunctional isocyanate is 4,4-methylenebis(cyclohexyl isocyanate) ($H_{12}$-MDI); and, (ii) a prepolymer polyol, wherein the prepolymer polyol is selected from the group consisting of diols, polyols, polyol diols, copolymers thereof, and mixtures thereof.

Preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. More preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol.

Preferably, the polyfunctional isocyanate having an average of at least two unreacted isocyanate (NCO) groups per molecule is an isocyanate terminated urethane prepolymer having 5.5 to 11.5 wt % (preferably, 6 to 11 wt %; more preferably, 7 to 10.5 wt %; most preferably, 7.25 to 10.5 wt %) unreacted isocyanate (NCO) groups.

Preferably, the amine initiated polyol curative contains at least one nitrogen atom per molecule and an average of at least three hydroxyl groups per molecule. More preferably, the amine initiated polyol curative contains one to four (still more preferably two to four; most preferably two) nitrogen atoms per molecule and an average of three to six (still more preferably three to five; most preferably four) hydroxyl groups per molecule.

Preferably, the amine initiated polyol curative has a number average molecular weight, $M_N$, of ≤700. More preferably, the amine initiated polyol curative used has a number average molecular weight, $M_N$, of 150 to 650 (still more preferably 200 to 500; most preferably 250 to 300).

Preferably, the amine initiated polyol curative has a hydroxyl number (as determined by ASTM Test Method D4274-11) of 350 to 1,200 mg KOH/g. More preferably, the amine initiated polyol curative has a hydroxyl number of 400 to 1,000 mg KOH/g (most preferably 600 to 850 mg KOH/g).

Examples of commercially available amine initiated polyol curatives include the Voranol® family of amine initiated polyols (available from The Dow Chemical Company); the Quadrol® Specialty Polyols (N,N,N',N'-tetrakis (2-hydroxypropyl ethylene diamine)) (available from BASF); Pluracol® amine based polyols (available from BASF); Multranol® amine based polyols (available from Bayer MaterialScience LLC); triisopropanolamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Preferably, in the method of chemical mechanical polishing a substrate of the present invention, the chemical mechanical polishing pad provided, comprises: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) a plurality of microelements.

Preferably, the plurality of microelements is selected from entrapped gas bubbles, hollow core polymeric materials, water soluble materials and an insoluble phase material (e.g., mineral oil). More preferably, the plurality of microelements is selected from entrapped gas bubbles and hollow core polymeric materials. Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements is incorporated into the polishing layer composition at 0 to 35 vol % porosity (more preferably 10 to 25 vol % porosity). Preferably, the plurality of microelements is distributed throughout the polishing layer composition.

Preferably, in the method of chemical mechanical polishing a substrate of the present invention, the chemical mechanical polishing pad provided, comprises: a polishing layer having a composition, a polishing surface and a removal rate selectivity between a silicon oxide material and a silicon nitride material, wherein the composition is a reaction product of ingredients, comprising: (a) a polyfunctional isocyanate having an average of at least two unreacted isocyanate (NCO) groups per molecule; (b) an amine initiated polyol curative, wherein the amine initiated polyol curative contains at least one nitrogen atom per molecule and wherein the amine initiated polyol curative has an average of at least three hydroxyl groups per molecule; and, (c) optionally, a plurality of microelements; wherein a stoichiometric ratio of reactive hydrogen groups in the amine initiated polyol curative of (b) to the at least two unreacted isocyanate groups in the polyfunctional isocyanate of (a) is selected to tune the removal rate selectivity of the polishing layer. Preferably, the selected stoichiometric ratio of reactive hydrogen groups in the amine initiated polyol curative of (b) to the at least two unreacted isocyanate groups in the polyfunctional isocyanate of (a) is 1.25 to 1.8. More preferably, the selected stoichiometric ratio of reactive hydrogen groups in the amine initiated polyol curative of (b) to the at least two unreacted isocyanate groups in the polyfunctional isocyanate of (a) is 1.3 to 1.8 (still more preferably; 1.40 to 1.8; most preferably, 1.45 to 1.75).

Preferably, in the method of chemical mechanical polishing a substrate of the present invention, the chemical mechanical polishing pad provided, comprises: a polishing layer having a composition, a polishing surface and a removal rate selectivity between a silicon oxide material and a silicon nitride material; wherein the polishing surface is adapted for polishing the substrate.

Preferably, the polishing surface is adapted for polishing the substrate by imparting the polishing surface with a macrotexture. More preferably, the polishing surface is adapted for polishing the substrate by imparting the polishing surface with a macrotexture, wherein the macrotexture is selected from at least one of perforations and grooves. Perforations can extend from the polishing surface part way or all the way through a thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, the polishing surface is adapted for polishing the substrate by imparting the polishing surface with a macrotexture, wherein the macrotexture comprises a groove pattern formed in the polishing layer at the polishing surface. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

Preferably, the chemical mechanical polishing pad provided in the method of the present invention has a polishing layer with an average thickness of 20 to 150 mils (more preferably 30 to 125 mils; most preferably 40 to 120 mils).

The chemical mechanical polishing pad provided in the method of the present invention has a polishing layer that can be provided in both porous and nonporous (i.e., unfilled) configurations. Preferably, the chemical mechanical polishing pad provided in the method of the present invention has a polishing layer with a density of ≥0.6 g/cm$^3$ as measured according to ASTM D1622. More preferably, in the chemical mechanical polishing pad provided in the method of the present invention has a polishing layer with a density of 0.7 to 1.1 g/cm$^3$ (more preferably, 0.75 to 1.0; most preferably, 0.75 to 0.95) as measured according to ASTM D1622.

Preferably, the chemical mechanical polishing pad provided in the method of the present invention has a polishing layer with a Shore D hardness of 10 to 60 as measured according to ASTM D2240. More preferably, the chemical mechanical polishing pad provided in the method of the present invention has a polishing layer with a Shore D hardness of 15 to 50 (most preferably 20 to 40) as measured according to ASTM D2240.

Preferably, the chemical mechanical polishing pad provided in the method of the present invention has a polishing layer with an elongation to break of 100 to 500% (more preferably, 200 to 450%; most preferably, 300 to 400%) as measured according to ASTM D412.

Preferably, the chemical mechanical polishing pad provided in the method of the present invention has a polishing layer with a toughness of 10 to 50 MPa (more preferably, 15 to 40 MPa; most preferably, 20 to 30 MPa) as measured according to ASTM D1708-10.

Preferably, the chemical mechanical polishing pad provided in the method of the present invention has a polishing layer with a tensile strength of 5 to 35 MPa (more preferably, 7.5 to 20 MPa; most preferably, 10 to 15 MPa) as measured according to ASTM D1708-10.

Preferably, the chemical mechanical polishing pad provided in the method of the present invention is adapted to be interfaced with a platen of a polishing machine. More preferably, the chemical mechanical polishing pad provided in the method of the present invention is adapted to be affixed to the platen of a polishing machine. Most preferably, the chemical mechanical polishing pad provided in the method of the present invention is designed to be affixed to the platen using at least one of a pressure sensitive adhesive and vacuum. Preferably, the chemical mechanical polishing pad provided in the method of the present invention further comprises a platen adhesive, wherein the platen adhesive is disposed on a side of the chemical mechanical polishing pad opposite the polishing surface.

Preferably, the chemical mechanical polishing pad provided in the method of the present invention further comprises at least one additional layer interfaced with the polishing layer. Preferably, the chemical mechanical polishing pad provided in the method of the present invention further comprises a compressible base layer adhered to the polishing layer. The compressible base layer preferably improves conformance of the polishing layer to the surface of the substrate being polished. Preferably, the compressible base layer is adhered to the polishing layer via a stack adhesive interposed between the compressible base layer and the polishing layer. Preferably, the stack adhesive is selected from the group consisting of a pressure sensitive adhesive, a hot melt adhesive, a contact adhesive and combinations thereof. More preferably, the stack adhesive is selected from the group consisting of a pressure sensitive adhesive and a hot melt adhesive. Most preferably, the stack adhesive is a reactive hot melt adhesive.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad provided in the method of the present invention, optionally further comprises an endpoint detection window. Preferably, the endpoint detection window is selected from an integral window incorporated into the polishing layer; and, a plug in place endpoint detection window block incorporated into the chemical mechanical polishing pad provided.

Preferably, the method of chemical mechanical polishing a substrate of the present invention, further comprises: providing a polishing machine having a rotating platen, a rotating head and a rotating conditioner; wherein the polishing layer is mounted to the rotating platen; wherein the substrate is secured to the rotating head; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; wherein the polishing slurry is supplied to the polishing surface at a flow rate of 200 mL/min.

Preferably, the method of chemical mechanical polishing a substrate of the present invention, further comprises: providing a polishing machine having a rotating platen, a rotating head and a rotating conditioner; wherein the polishing layer is mounted to the rotating platen; wherein the substrate is secured to the rotating head; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; wherein the polishing slurry is supplied to the polishing surface at a flow rate of 200 mL/min; wherein the rotating conditioner is a diamond abrasive disk; wherein the polishing surface is abraded using the rotating conditioner; wherein the rotating conditioner is pressed against the polishing surface with a conditioner force of 7 lbs normal to the polishing surface.

Preferably, the method of making a polishing layer for a chemical mechanical polishing pad of the present invention, comprises: providing (a) a polyfunctional isocyanate having an average of at least two unreacted isocyanate groups per molecule (preferably, wherein the isocyanate terminated urethane prepolymer is a reaction product of ingredients comprising: (i) an aliphatic polyfunctional isocyanate and (ii) a prepolymer polyol; preferably, wherein the polyfunctional isocyanate provided is an isocyanate terminated urethane prepolymer having 5.5 to 11.5 wt % (preferably, 6 to 11 wt %; more preferably, 7 to 10.5 wt %; most preferably, 7.25 to 10.5 wt %) unreacted isocyanate (NCO) groups); and, providing (b) an amine initiated polyol curative, wherein the amine initiated polyol curative contains at least one nitrogen atom per molecule and wherein the amine initiated polyol curative has an average of at least three hydroxyl groups per molecule; combining the polyfunctional isocyanate and the amine initiated polyol curative to form a combination; wherein a stoichiometric ratio of reactive hydrogen groups (i.e., the sum of the amine ($NH_2$) groups and the hydroxyl (OH) groups) in the amine initiated polyol curative to the at least two unreacted isocyanate (NCO) groups in the polyfunctional isocyanate in the combination is 1.25 to 1.8 (preferably, 1.3 to 1.8; more preferably; 1.40 to 1.8; most preferably, 1.45 to 1.75); and, wherein the stoichiometric ratio of reactive hydrogen groups in the amine initiated polyol curative of (b) to the at least two unreacted isocyanate (NCO) groups in the polyfunctional isocyanate of (a) in the combination is selected to tune a silicon dioxide to silicon nitride removal rate selectivity of the polishing layer.

Some embodiments of the present invention will now be described in detail in the following Examples.

Comparative Example C1 and Examples 1-3

Polishing layers were prepared according to the formulation details provided in TABLE 2. Specifically, polyurethane cakes were prepared by the controlled mixing of the isocyanate terminated urethane prepolymer at 51° C. for the Adiprene® LFG963A available from for Comparative Example C1; and, 65° C. for the Adiprene® LW570 for Examples 1-3; both available from Chemtura Corporation, with the curative noted in TABLE 2. The MBOCA was maintained at a premixing temperature of 116° C. The ratio of the isocyanate terminated urethane prepolymer and the curative was set such that the stoichiometry, as defined by the ratio of active hydrogen groups (i.e., the sum of the —OH groups and —$NH_2$ groups) in the curative to the unreacted isocyanate (NCO) groups in the isocyanate terminated urethane prepolymer, was as noted in Table 2.

Porosity was introduced into the polishing layers by adding Expancel® microspheres to the isocyanate terminated urethane prepolymer prior to combining with the curative to achieve the desired porosity and polishing layer density.

The isocyanate terminated urethane prepolymer with any incorporated Expancel® microspheres and the curative were mixed together using a high shear mix head. After exiting the mix head, the combination was dispensed over a period of 5 minutes into a 86.4 cm (34 inch) diameter circular mold to give a total pour thickness of approximately 10 cm (4 inches). The dispensed combination was allowed to gel for 15 minutes before placing the mold in a curing oven. The mold was then cured in the curing oven using the following cycle: 30 minutes ramp from ambient temperature to a set point of 104° C., then hold for 15.5 hours at 104° C., and then 2 hour ramp from 104° C. to 21° C.

The cured polyurethane cakes were then removed from the mold and skived (cut using a moving blade) at a temperature of 30 to 80° C. into 2.0 mm (80 mil) thick sheets. Skiving was initiated from the top of each cake. Any incomplete sheets were discarded.

The ungrooved, polishing layer materials from each of Comparative Example C1 and Examples 1-3 were analyzed to determine their physical properties as reported in TABLES 2-3. Note that the density data reported were determined according to ASTM D1622; the Shore D hardness data reported were determined according to ASTM D2240; and, the elongation to break data reported were determined according to ASTM D412.

TABLE 2

| Ex # | Isocyanate terminated urethane prepolymer | Prepolymer (% NCO) | Curative (wt %) MBOCA | Curative (wt %) Voranol® 800 | Stoichiometry (Active H/NCO) | Expancel® Pore Former |
|---|---|---|---|---|---|---|
| C1 | Adiprene® LFG963A | 5.7 | 100 | 100 | 0.9 | 551DE40d42 |
| 1 | Adiprene® LW570 | 7.6 | 0 | 100 | 1.25 | 551DE20d60 |
| 2 | Adiprene® LW570 | 7.6 | 0 | 100 | 1.50 | 551DE20d60 |
| 3 | Adiprene® LW570 | 7.6 | 0 | 100 | 1.75 | 551DE20d60 |

Adiprene® LFG963A isocyanate terminated urethane prepolymer is available from Chemtura Corporation.
Adiprene® LW570 isocyanate terminated urethane prepolymer is available from Chemtura Corporation.
Expancel® polymeric microballoons with shell walls of polyacrylonitrile copolymer are available from Akzo Nobel.

TABLE 3

| Ex. # | Density (g/cm$^3$) | Shore D Hardness (15s) | Tensile strength (MPa) | Elongation to break (%) | Toughness (MPa) |
|---|---|---|---|---|---|
| C1 | 0.88 | 41 | 14.9 | 293 | 32.0 |
| 1 | 0.76 | 39 | 11.5 | 113 | 10.2 |
| 2 | 0.79 | 32 | 13.6 | 254 | 21.0 |
| 3 | 0.79 | 23 | 11.7 | 363 | 23.3 |

TABLE 4

| | Polishing pH 3.0 | | Polishing pH 4.5 | |
|---|---|---|---|---|
| Polishing layer of Ex. # | Silicon oxide removal rate Å/min | Silicon nitride removal rate Å/min | Silicon oxide removal rate Å/min | Silicon nitride removal rate Å/min |
| C1 | 1407 | 216 | 523 | 46 |
| 1 | 2325 | 327 | 795 | 73 |
| 2 | 2067 | 390 | 916 | 57 |
| 3 | 1722 | 35 | 1285 | 60 |

Polishing Experiments

Chemical mechanical polishing pads were constructed using polishing layers prepared according to Comparative Example C1 and Examples 1-3. The polishing layers were each machine grooved to provide a groove pattern in the polishing surface comprising a plurality of concentric circular grooves having dimensions of 70 mil (1.78 mm) pitch, 20 mil (0.51 mm) width and 30 mil (0.76 mm) depth. The polishing layers were then laminated to a polymer coated non-woven sub-pad layer (Suba IV subpad layers available from Rohm and Haas Electronic Materials CMP Inc.).

A polishing slurry was provided comprising 1 wt % silica abrasive (available from Fuso Chemical Co., Ltd.), having a positive charge measured at the polishing pH noted in TABLE 4 below; and, deionized water.

A Strasbaugh 6EC Wafer Polisher was used to polish 200 mm Silicon oxide and silicon nitride blanket wafers available from Novellus Systems, Inc. with the noted chemical mechanical polishing pads. The polishing conditions used in all of the polishing experiments included a platen speed of 93 rpm; a carrier speed of 87 rpm; with a polishing slurry flow rate of 200 mL/min and a down force of 20.7 kPa. A Kinik CG181060 diamond conditioning disk (commercially available from Kinik Company) was used to condition the chemical mechanical polishing pads. The chemical mechanical polishing pads were each broken in with the conditioner ex situ using a down force of 7 lbs (3.18 kg) for 40 minutes. The polishing pads were further conditioned in situ during polishing using a down force of 7 lbs (3.18 kg). The removal rates were determined by measuring the film thickness before and after polishing using a KLA-Tencor FX200 metrology tool using a 49 point spiral scan with a 3 mm edge exclusion. The results of the removal rate experiments are provided in TABLE 4.

We claim:

1. A method of chemical mechanical polishing a substrate, comprising:
   providing the substrate, wherein the substrate comprises a silicon oxide and a silicon nitride;
   providing a polishing slurry, comprising:
     water; and,
     a silica abrasive, wherein the silica abrasive has a positive surface charge measured at a polishing pH of 1 to 6;
   providing a chemical mechanical polishing pad, comprising:
   a polishing layer having a composition, a polishing surface and a removal rate selectivity between a silicon oxide material and a silicon nitride material, wherein the composition is a reaction product of ingredients, comprising:
     (a) a polyfunctional isocyanate having an average of at least two unreacted isocyanate (NCO) groups per molecule;
     (b) an amine initiated polyol curative, wherein the amine initiated polyol curative contains at least one nitrogen atom per molecule and wherein the amine initiated polyol curative has an average of at least three hydroxyl groups per molecule; and,
     (c) optionally, a plurality of microelements;
     wherein a stoichiometric ratio of reactive hydrogen groups in the amine initiated polyol curative of (b) to the at least two unreacted isocyanate (NCO) groups in the polyfunctional isocyanate of (a) is selected to tune the removal rate selectivity; and wherein the stoichiometric ratio of reactive hydrogen groups in the amine initiated polyol curative of (b) to the at least two unreacted isocyanate (NCO) groups in the polyfunctional isocyanate of (a) is 1.25 to 1.8;
   creating dynamic contact at an interface between the polishing surface and the substrate to polish a surface of the substrate;

dispensing the polishing slurry onto the chemical mechanical polishing pad at or near the interface between the polishing surface and the substrate; and, removing at least some of the silicon oxide and the silicon nitride from the substrate.

2. The method of claim 1, further comprising:

providing a polishing machine having a rotating platen, a rotating head and a rotating conditioner; wherein the polishing layer is mounted to the rotating platen; wherein the substrate is secured to the rotating head; wherein the rotating platen is rotated at a platen speed of 93 revolutions per minute; wherein the rotating head is rotated at a head speed of 87 revolutions per minute; wherein the substrate is pressed against the polishing surface of the polishing layer with a down force of 3 psi; wherein the polishing slurry is supplied to the polishing surface at a flow rate of 200 mL/min.

3. The method of claim 2, wherein the rotating conditioner is a diamond abrasive disk; wherein the polishing surface is abraded using the rotating conditioner; wherein the rotating conditioner is pressed against the polishing surface with a conditioner force of 7 lbs normal to the polishing surface.

4. The method of claim 1, wherein the composition of the polishing layer provided is the reaction product of ingredients including the amine initiated polyol curative; wherein the amine initiated polyol curative contains an average of two nitrogen atom per molecule and an average of four hydroxyl groups per molecule; and, wherein the amine initiated polyol curative has a number average molecular weight, $M_N$, of 200 to 400.

5. The method of claim 1, wherein the composition of the polishing layer provided is the reaction product of ingredients including the plurality of microelements, wherein the plurality of microelements is selected from entrapped gas bubbles, gas filled hollow core polymeric materials, liquid filled hollow core polymeric materials, water soluble materials and an insoluble phase material.

6. The method of claim 1, wherein the composition of the polishing layer provided is the reaction product of ingredients including the plurality of microelements, wherein the plurality of microelements are gas filled hollow core polymeric materials.

7. The method of claim 6, wherein the composition of the polishing layer provided contains 10 to 25 vol % of the gas filled hollow core polymeric materials.

8. The method of claim 1, wherein the chemical mechanical polishing pad provided, further comprises:

a subpad having a top surface and a bottom surface, wherein the top surface is interfaced with the polishing layer on a side of the polishing layer opposite that of the polishing surface; and, a pressure sensitive platen adhesive, wherein the pressure sensitive platen adhesive is disposed on the bottom surface of the subpad.

9. A chemical mechanical polishing pad, comprising:

a polishing layer having a composition, a polishing surface and a removal rate selectivity between a silicon oxide material and a silicon nitride material; wherein the composition is a reaction product of ingredients, comprising:

(a) a polyfunctional isocyanate having an average of at least two unreacted isocyanate (NCO) groups per molecule; and, (b) an amine initiated polyol curative, wherein the amine initiated polyol curative contains at least one nitrogen atom per molecule and wherein the amine initiated polyol curative has an average of at least three hydroxyl groups per molecule;

wherein a stoichiometric ratio of reactive hydrogen groups in the amine initiated polyol curative of (b) to the at least two unreacted isocyanate (NCO) groups in the polyfunctional isocyanate of (a) is 1.25 to 1.8; and, wherein the stoichiometric ratio of reactive hydrogen groups in the amine initiated polyol curative of (b) to the at least two unreacted isocyanate (NCO) groups in the polyfunctional isocyanate of (a) is selected to tune the removal rate selectivity.

10. A method of making a polishing layer for a chemical mechanical polishing pad, comprising:

providing (a) a polyfunctional isocyanate having an average of at least two unreacted isocyanate (NCO) groups per molecule; and, providing (b) an amine initiated polyol curative, wherein the amine initiated polyol curative contains at least one nitrogen atom per molecule and wherein the amine initiated polyol curative has an average of at least three hydroxyl groups per molecule;

combining the polyfunctional isocyanate and the amine initiated polyol curative to form a combination; wherein a stoichiometric ratio of reactive hydrogen groups in the amine initiated polyol curative of the at least two unreacted isocyanate (NCO) groups in the polyfunctional isocyanate in the combination is 1.25 to 1.8; and, wherein the stoichiometric ratio of reactive hydrogen groups in the amine initiated polyol curative of (b) to the at least two unreacted isocyanate (NCO) groups in the polyfunctional isocyanate of (a) in the combination is selected to tune a silicon dioxide to silicon nitride removal rate selectivity of the polishing layer.

* * * * *